(12) United States Patent
Kerdiles et al.

(10) Patent No.: US 8,580,654 B2
(45) Date of Patent: Nov. 12, 2013

(54) METHOD FOR MOLECULAR BONDING OF SILICON AND GLASS SUBSTRATES

(75) Inventors: Sébastien Kerdiles, Saint Ismier (FR); Daniel Delprat, Crolles (FR)

(73) Assignee: Soitec, Bernin (FR)

( * ) Notice: Subject to any disclaimer, the term of this patent is extended or adjusted under 35 U.S.C. 154(b) by 176 days.

(21) Appl. No.: 13/248,763

(22) Filed: Sep. 29, 2011

(65) Prior Publication Data

US 2012/0088350 A1   Apr. 12, 2012

(30) Foreign Application Priority Data

Oct. 12, 2010   (FR) ..................................... 10 58299

(51) Int. Cl.
  *H01L 21/30*   (2006.01)
  *H01L 21/46*   (2006.01)

(52) U.S. Cl.
  USPC ................................... 438/455; 257/E21.211

(58) Field of Classification Search
  USPC ................................... 438/455; 257/E21.211
  See application file for complete search history.

(56) References Cited

U.S. PATENT DOCUMENTS

| 5,273,553 A | 12/1993 | Hoshi et al. ................... 29/25.01 |
| RE36,890 E | 10/2000 | Wells et al. ..................... 156/153 |
| 7,176,528 B2 | 2/2007 | Couillard et al. .............. 257/347 |
| 2003/0010275 A1 | 1/2003 | Radojevic et al. ................. 117/2 |
| 2009/0004407 A1* | 1/2009 | Watanabe ........................ 428/1.1 |
| 2009/0280595 A1 | 11/2009 | Broekaart et al. .............. 438/66 |
| 2010/0093152 A1* | 4/2010 | Kerdiles et al. ............... 438/455 |
| 2012/0017703 A1* | 1/2012 | Ikebe et al. .............. 73/862.626 |
| 2012/0020760 A1* | 1/2012 | Huang ..................... 414/225.01 |

FOREIGN PATENT DOCUMENTS

| JP | H05-217819 A | 8/1993 |
| JP | 8195334 A | 7/1996 |
| JP | 8293131 A | 11/1996 |
| JP | 3084919 A | 9/2000 |
| JP | 2007-134433 A | 5/2007 |
| WO | WO 2007/047536 A2 | 4/2007 |
| WO | WO 2009/135800 A2 | 11/2009 |

OTHER PUBLICATIONS

Search Report, French Application No. 1058299 dated Jan. 31, 2011.

* cited by examiner

*Primary Examiner* — Phuc Dang
(74) *Attorney, Agent, or Firm* — Winston & Strawn LLP

(57) ABSTRACT

The present invention concerns a method for bonding a first substrate having a first surface to a second substrate having a second surface. This method includes the steps of holding the first substrate by at least two support points, positioning the first substrate and the second substrate so that the first surface and the second surface face each other, deforming the first substrate by applying between at least one pressure point and the two support points a strain toward the second substrate, bringing the deformed first surface and the second surface into contact, and progressively releasing the strain to facilitate bonding of the substrates while minimizing or avoiding the trapping of air bubbles between the substrates.

20 Claims, 9 Drawing Sheets

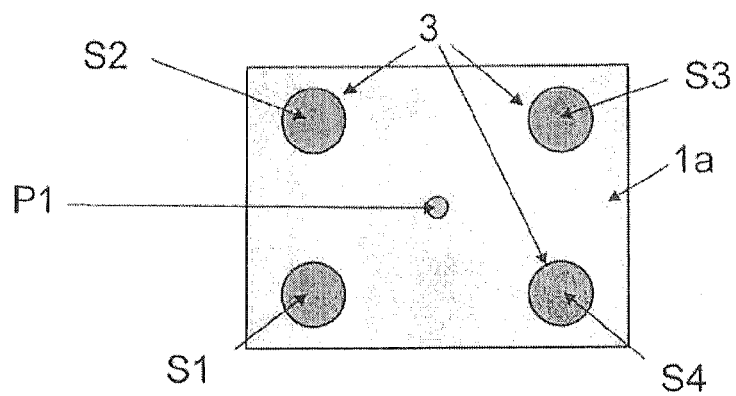
FIG. 4
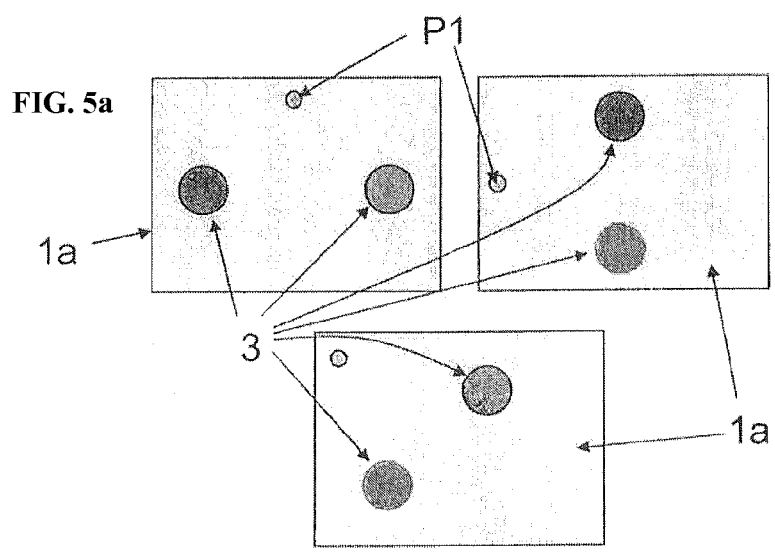
FIG. 5a  FIG. 5b
FIG. 5c

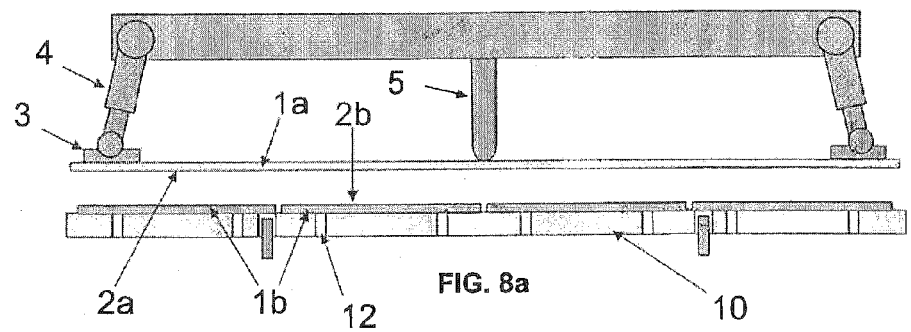
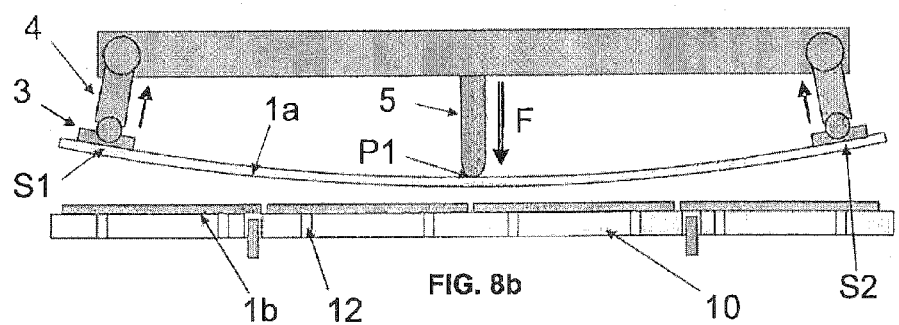
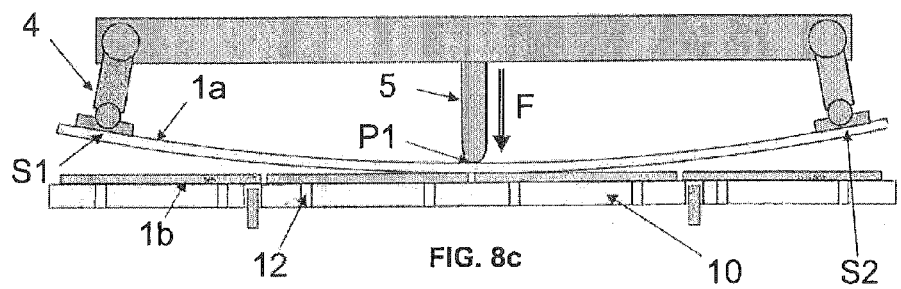

METHOD FOR MOLECULAR BONDING OF SILICON AND GLASS SUBSTRATES

FIELD OF THE INVENTION

The field of this invention is that of Silicon On Glass (SiOG) structures. More precisely, the invention relates to an improved method for making such structures.

BACKGROUND OF THE INVENTION

Silicon On Insulator (SOI) technology is becoming increasingly important for high performance thin film transistors, solar cells, etc. SOI wafers consist of a thin useful layer of substantially single crystal silicon having a thickness that generally is less than one micron, with the layer supported on an insulating material.

Various structures and various ways of obtaining such wafers are known. Typically, used structures are formed with a thin film of silicon bonded to another silicon wafer with an oxide insulator layer in between.

Because of its rather high thickness, in particular as compared to the other parts, a major fraction of the cost of such structures has been the cost of the silicon substrate which supports the oxide layer, topped by the thin silicon layer. Thus, to lower the cost of SOI structures, the use of support substrate made of materials less expensive than silicon has been tried, in particular glass or glass-ceramics.

SOI structures using such glass-based substrates are called SiOG structures, as already mentioned. Processes for providing a SiOG structure are for example described by U.S. Pat. No. 7,176,528. Such a process is represented by FIG. 1. A source substrate 1b, generally made of silicon, is implanted with ionic species such as hydrogen. The implantation leads to the creation of a buried, weakened zone 7. Further, the source substrate 1b is bonded with a glass-based support substrate 1a and then separated by splitting the source substrate 1b to a depth corresponding to the penetration depth of the implanted species. In this way, a SiOG structure containing the original glass-based support substrate 1a and a layer 8 from the source substrate 1b, and a remaining delaminated substrate being a part of the former source substrate 1b are produced.

It is not a simple matter, however, to replace a traditional SOI support substrate with a glass-based support substrate. One potential issue with SiOG is that a glass-based support substrate 1a generally contains metals (in particular alkali metals) and other components which may be harmful to silicon or other semiconductor materials of the useful layer 8 from the source substrate 1b. Therefore, a barrier layer is generally required between the glass-based support substrate 1a and the source substrate 1b. Moreover, this barrier layer may facilitate the bonding between the silicon layer 8 and the glass-based support substrate 1a by making hydrophilic the bonding surface of the silicon layer 8. In this regard, a SiO$_2$ layer can be used as a barrier layer to obtain hydrophilic surface conditions between the glass-based support substrate 1a and the silicon layer 8.

A native SiO$_2$ layer can be directly formed on a silicon source substrate 1b by exposing it to the atmosphere prior to bonding. Alternatively, when anodic bonding is used, the anodic bonding process produces "in situ" a SiO$_2$ layer between the silicon source substrate 1b and the glass-based support substrate 1a. Also, a SiO$_2$ layer can be actively deposited or grown on the source substrate 1b prior to bonding.

U.S. Pat. No. 7,176,528 discloses another type of a barrier layer which can provided by the anodic bonding process. This barrier layer is a modified top layer of glass in the glass-based support substrate 1a, namely, a glass layer having a reduced level of ions. The disclosed anodic bonding substantially removes alkali and alkali earth glass constituents and other positive modifier ions that are harmful for silicon for a distance of about 100 nm to form a thick top layer on the glass-based substrate.

Molecular bonding is then usually performed by putting the two substrate surfaces into very close contact. Pressure is applied to the substrates by means of a mechanical piston in order to locally approach the two surfaces at a sub-nanometer scale distance. In case of hydrophilic bonding, it leads to the establishment of hydrogen bonds in between water molecules adsorbed at the two hydrophilic surfaces. With the progressive establishment of hydrogen bonds at the edges of the already bonded area, the bonded area gradually increases. A bonding wave thus propagates until it reaches the edge of at least one of the substrates. Any disturbance of the bonding wave propagation or of the bonding wave closure at the edge of a substrate may lead to the trapping of an air bubble 9. Such air bubbles 9 locally prevent the substrates to bond, which causes holes in the layer 8 separated from the source substrate 1b and bonded to the glass-based support substrate 1a, as represented in FIG. 2.

There is consequently a need for a method for bonding the two substrates that avoids the trapping of bubbles during the molecular bonding.

SUMMARY OF THE INVENTION

The present invention now provides high quality bubble-free bonded substrates of silicon and glass. Moreover, the present invention also aims at providing an efficient bonding of series of substrates, in order to speed up industrial processes and save cost.

For these purposes, the present invention provides a method for bonding a first substrate having a first surface to a second substrate having a second surface, characterized in that it comprises:

holding the first substrate by at least two support points, positioning the first substrate and the second substrate so that the first surface and the second surface face each other, deforming the first substrate by applying between at least one pressure point and the two support points, a strain toward the second substrate, bringing the deformed first surface and the second surface into contact, and progressively releasing the strain.

Preferred but non limiting features of the present invention are as follow:

the surface area of the convex hull formed by the set of pressure points is null and the surface area of the convex hull formed by the set of support and pressure points is non-null;

the first substrate is held by suckers or suction cups placed at the support points;

each sucker or suction cup is linked to a telescopic arm;

the second substrate is placed on a support comprising at least two spacers respectively on each sides of the second substrate, said spacers being higher than the thickness of the second substrate;

the first substrate is held by resting on the spacers, the support points being points of contact between the spacers and the first substrate;

the support comprises at least one sucker or suction cup for holding the second substrate;

the strain is applied by at least one piston rod;

the first substrate is a glass sheet, and wherein the second substrate is a silicon tile;

the first substrate is sequentially bonded to a plurality of second substrates by applying a strain to the first substrate per second substrate;

the at least one piston rod is mounted on a mobile device and sequentially applies each strain to the first substrate;

the first substrate is simultaneously bonded to a plurality of second substrates by deforming the whole first substrate.

BRIEF DESCRIPTION OF THE DRAWINGS

The above and other features and advantages of this invention will be apparent in the following detailed description of an illustrative embodiment thereof, which is to be read in connection with the accompanying drawings wherein:

FIG. 4 represents an embodiment of a step of holding a substrate in a process according to the invention;

FIGS. 5a-e represents alternative embodiment of a step of holding a substrate in a process according to the invention;

FIGS. 8a-f represents successive steps of another embodiment of a process according to the invention.

DETAILED DESCRIPTION OF A PREFERRED EMBODIMENT

Figure 1:
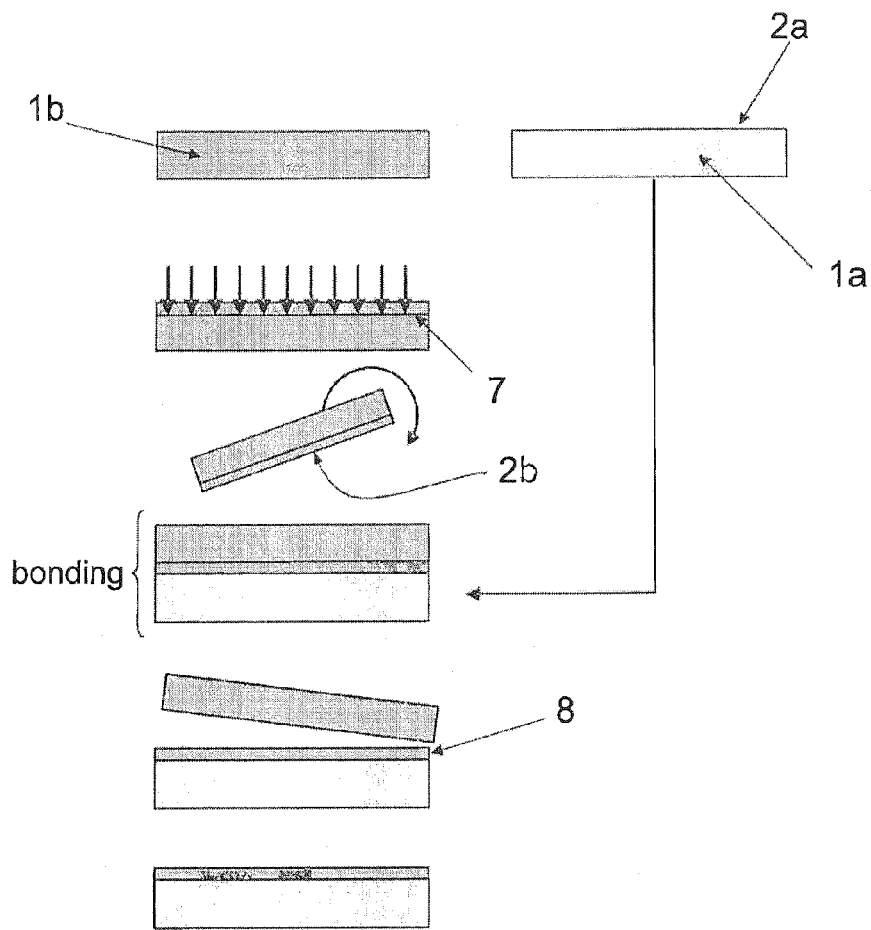
FIG. 1 previously described represents steps of a known process for making SiOG structures.
Figure 2:
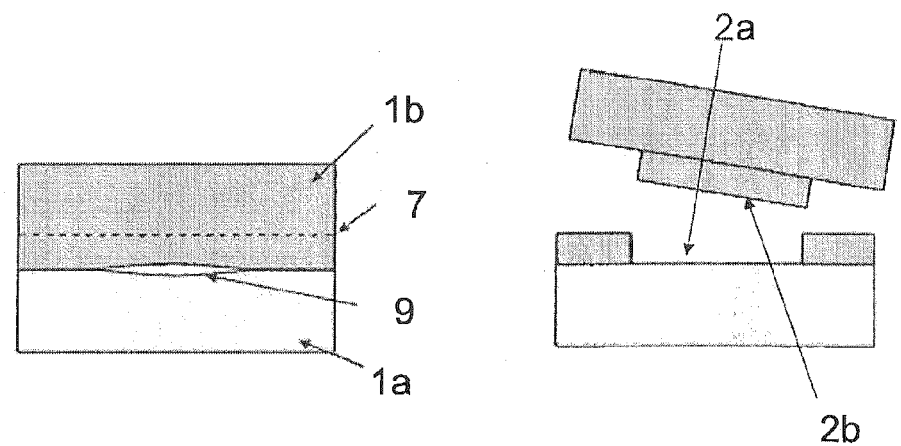
FIG. 2 previously described is a traversal view of a detail of a defect due to the presence of a bubble in a SOI structure.

Referring to the drawings, a method according to a preferred embodiment of the invention will now be described.

Figure 3:
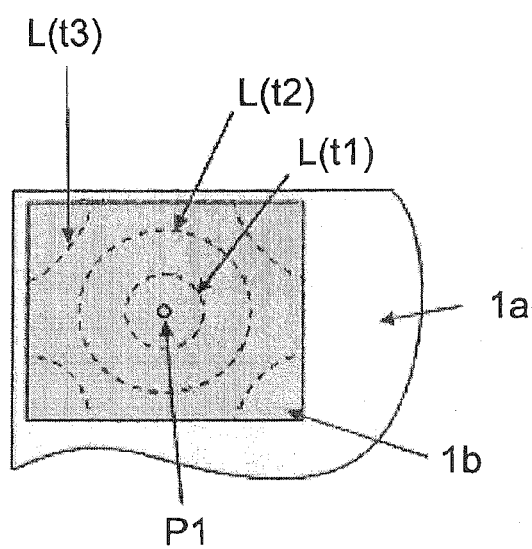
FIG. 3 represents a bonding propagation wave during a molecular bonding.

To avoid the trapping of bubbles, the best solution is to carefully control the propagation of the bonding wave, as represented by FIG. 3. Indeed, the bonding wavefront is the curve delimiting at a given time the area already bonded (i.e., already traveled by the bonding wave), and extending towards unbounded areas by molecular attraction. A bubble is trapped if two distinct points of this curve join, thereby surrounding an unbound area. As air cannot escape from such a surrounded unbound area, the bonding wavefront stops. So, at any moment, the bonding wavefront has to be continuous.

In the represented case, the bonding starts by a contact at the point P1. Then, the bonding wavefront radially extents: L(t1), L(t2) and L(t3) represent the position of the bonding wavefront at three instants t1<t2<t3. From the central bonding initiation, the bonding wavefront extends up to the edges of the second substrate 1b, expelling the air without trapping it.

In this context, the invention proposes a method for bonding a first substrate 1a having a first surface 2a to a second substrate 1b having a second surface 2b, in which the propagation of the bonding wave is controlled. The first substrate 1a is held by at least two support points S1 and S2, positioned near (e.g. 100 to 1000 microns) the second substrate 1b so that first surface 2a and second surface 2b face each other. The first substrate is deformed in order to have a single contact between the two surfaces 2a and 2b. This deformation is obtained by applying between at least one pressure point P1 different from the two support points S1 and S2 a strain F toward the second substrate 1b, and then bringing the deformed first surface 2a and the second surface 2b into contact. The deformation may be performed until the deformed first surface 2a and the second surface 2b get into contact, or alternatively the first substrate 1a may be deformed, and then its first surface 1a brought into contact with the second surface 2a by translation once the deformation is complete. From this contact, which is located at the pressure point P1, the bonding wave is initiated. The warpage of the first substrate 1a is about a few hundreds of micrometers, which is very small compared to the lateral dimensions of typically used substrates, i.e. a few hundreds of millimeters. For instance, the force needed for obtaining a warpage of 200 microns in the middle of a 775 micron thick silicon substrate having a surface of 20 cm×20 cm and supported at its edges is about 1.3N, and the force needed for obtaining a warpage of 200 microns in the middle of a 500 micron thick silicon substrate having a surface of 20 cm×20 cm and supported at its edges is about 0.2N.

A first embodiment is represented on FIG. 4. In this advantageous embodiment, the first substrate 1a is held at four support points S1, S2, S3 and S4 by a vacuum system, a sucker or suction cup 3 being placed at each support point. The first substrate 1a is then positioned within a few tenths of millimeters above the second substrate.

FIG. 5a-e shows alternative geometries for support and pressure points that enable initiating the propagation of the bonding wave at different locations. Only two support points are required. The invention is not limited to any one of these geometries, and a man skilled in the art would know how to place support and pressure points according to the shape and the material of the first substrate 1a.

Figure 5D:
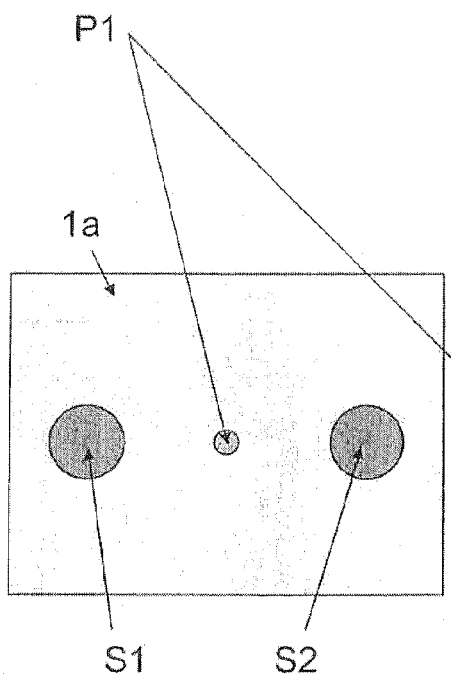
Figure 5E:
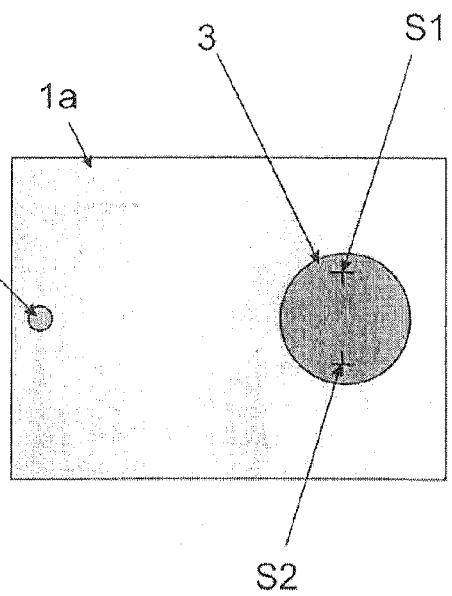

The geometry of support and pressure points may for example respect two conditions:

(1) at least two support points S1 and S2 have to be unaligned with at least one pressure point P1. In other words, the convex hull formed by the set of support and pressure points (i.e., the smallest polygon containing at least every point of this set) has to have a non-null surface area. However, there are no physical support means which are totally punctual: for example, a sucker or suction cup 3 enlarges upon several cm². Thus, if the suckers or suction cups 3 are large enough, geometries as represented by FIGS. 5d-e do not contradict this first condition and can be used in embodiment of the method according to the invention, as one sucker or suction cup 3 acts as a plurality of sufficiently distant support points.

(2) if there are at least three pressure points, they shall not form a triangle. In other words, the convex hull formed by the set of pressure points has to have a null surface area. If a triangle is formed, when contact between surfaces 2a and 2b is made, the bonding wavefront links the edges of the triangle, and air may be trapped inside. To the contrary, if all the pressure points are forming a line, no zone where air may be trapped appears.

The first substrate 1a is then bent by applying the strain F between the at least one pressure point P1 and the support points, for example thanks to the movement of a piston rod 5 in contact with the first substrate 1a at the pressure point P1. Besides, the contact between the piston rod 5 and the first substrate 1a may be linear and not punctual, according to the second condition explained above. In this case the strain F is applied between the support points (S1, S2) and a pressure line P. When the two surfaces 2a and 2b get in contact, the molecular bonding initiates.

The applied strain deforms the first substrate such that a central portion of the first substrate portion initially contacts the second substrate surface. When the strain is applied in a linear manner the central portion of the first substrate contacts the second substrate in a line of contact.

After the initial contact is made, the strain can be progressively released to propagate a bonding wave which bonds the substrates together. This final step of releasing the strain facilitates bonding of the substrates while minimizing or avoiding the trapping of air bubbles between the substrates. The release of the strain F to let the bonding wave propagate can be conducted in a number of ways.

A first considered possibility is to simply release the vacuum at one stroke and provoke a high-speed propagation of the bonding wave. It was found, however, that this propagation is faster at the edge of the substrate than elsewhere. Thus lateral parts of the bonding wavefront might join whereas the central part has not yet reached the edge of the substrate and this might cause the trapping of air bubbles.

To prevent this risk, the solution proposed by the invention is to progressively, and not suddenly, release the strain F applied between the support and pressure points (S1, S2, P1 . . . ), in order to control at any time the propagation of the bonding wave. To this end, suckers or suction cups 3 may be for example mounted on telescopic arms 4.

Advantageously, in a variant of the method according to the invention, the first substrate 1a is bonded to a plurality of second substrates 1b. Indeed, the first substrate 1a is for example a glass sheet, while the second substrate 1b is a silicon tile. Large sheets of glass can be easily manufactured, so that they can receive a plurality of silicon substrates, as said substrates have generally a width between 20 and 30 cm. However, the invention is not limited to the bonding of glass and silicon substrates.

FIGS. 6a-d schematically represent a bonding sequence of a first substrate 1a and a plurality of second substrates 1b according to a second advantageous embodiment of the invention.

Initially (FIG. 6a), the second substrates 1b are pre-positioned on a support 10 and maintained by an optional vacuum system of suckers or suction cups 12. The first substrate 1a is then positioned and laid on spacers 11 located on each side of the second substrates 1b (i.e. between two rows). These spacers 11 have a height exceeding the thickness of the second substrates, preferably by at least 200 μm. In the case of Silicon tiles having a thickness of e.g. 775 μm, the height of spacers 11 therefore reaches at least 975 μm. The spacers 11 are support lines for the first substrate 1a (there may however be a succession of dots instead).

Figure 7A:
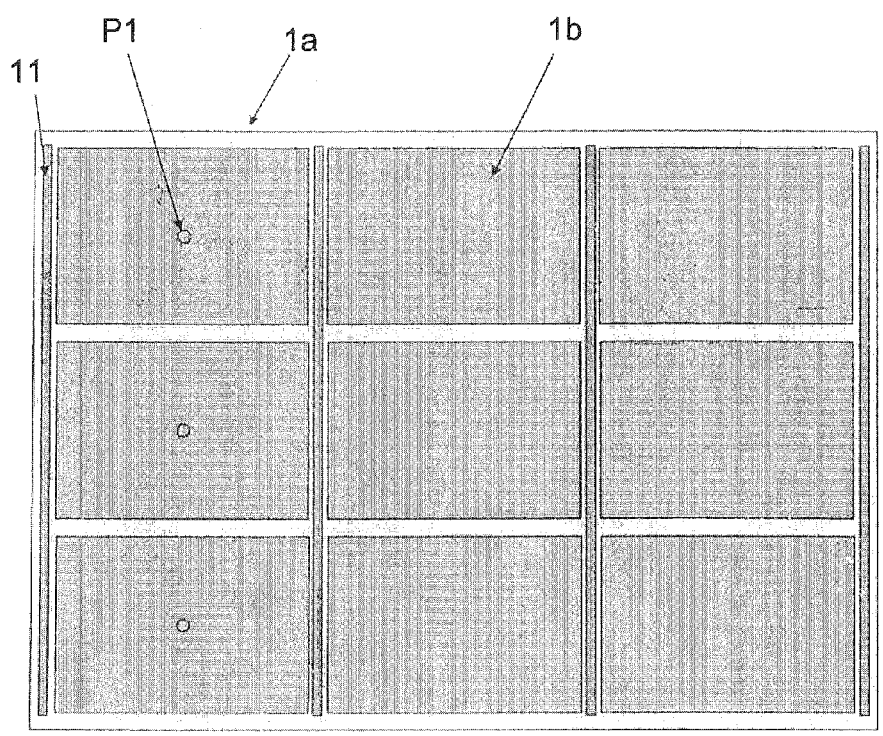
FIGS. 7a-b are upper views of alternative possible dispositions of substrates on a support in an embodiment of a process according to the invention.
Figure 7B:
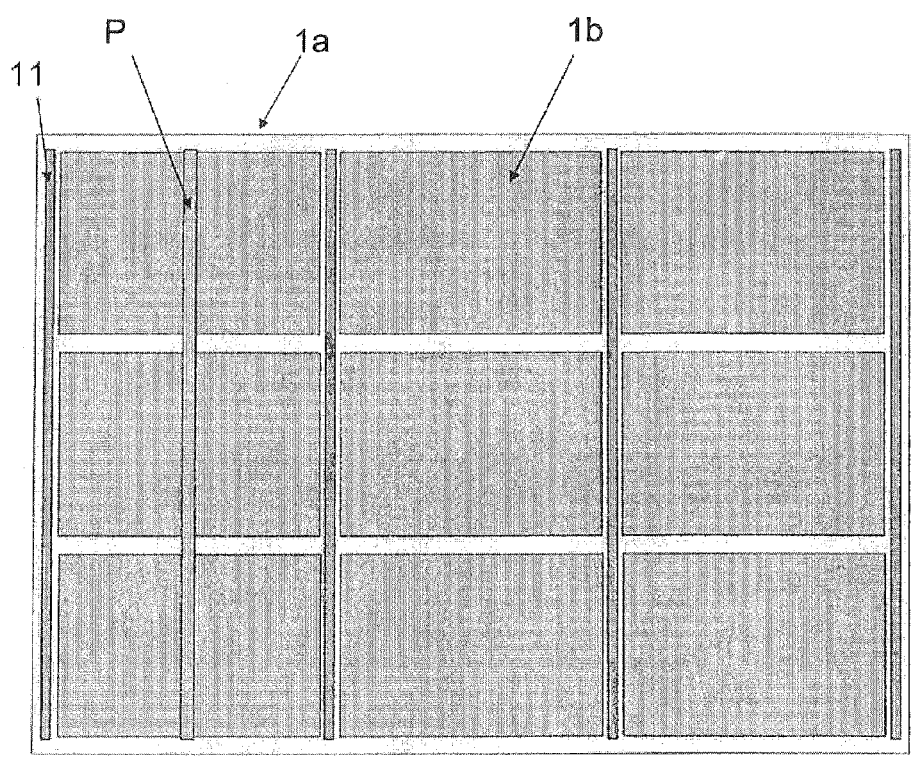

During a second step (FIG. 6b), the piston rod 5 applies the strain F. As already explained, the piston rod 5 can get in a punctual contact at the center of each tile or get in a linear contact (FIGS. 7a and 7b). The strain applied by piston rods 5 will then bend the first substrate 1a in between the linear spacers 11. The mechanical contact is then obtained for the one or several second substrate(s) 1b positioned between the spacers 11 and the first substrate 1a. The nine tiles shown on FIG. 7a may for example be bonded all the nine simultaneously (using nine pistons, or using three linear contact rods, not shown), or for example row by row (using three pistons as shown on FIG. 7a), or for example one by one (using one piston, not shown).

Figure 6A:
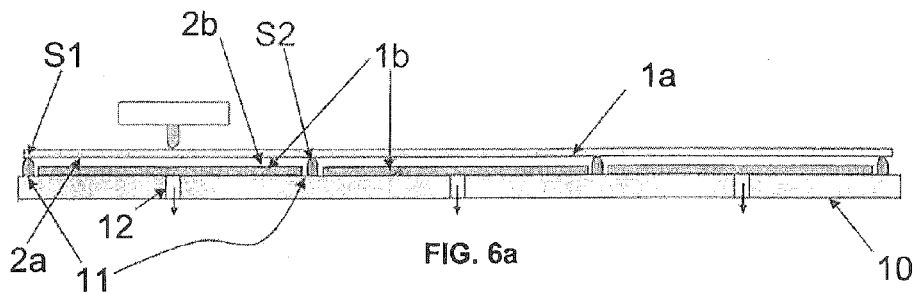
FIGS. 6a-d represents successive steps of an embodiment of a process according to the invention.
Figure 6B:
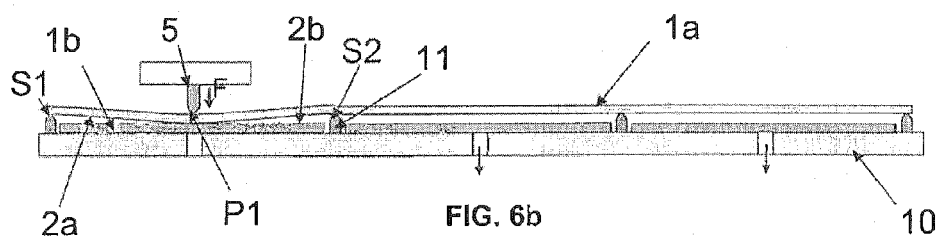
Figure 6C:
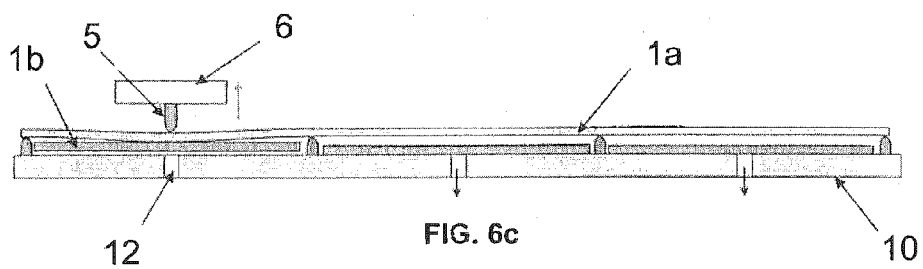

The sucker or suction cup 12 is then released, so the second substrate 1b becomes only held by the pressure point P1 where molecular bonding is made. The piston rod 5 is thus progressively shortened, the second substrate 1b rising up from the support 10 as the bonding wavefront extends (FIG. 6c). With a deformation of the first substrate 1a corresponding to a displacement of its edges with respect to the pressure point P1 of at least 200 μm (due to the height of each spacer 11), it is possible to control the bonding wave speed so that the bonding wave velocity ideally in each point of the bonding interface does not exceed the minimum bonding wave velocity that is observed in the center area of the bonding interface during an uncontrolled bonding, to prevent the formation of bubbles. The invention enables the bonding wave speed velocity to be reduced in the center as well as in the periphery of the bonding interface.

Figure 6D:
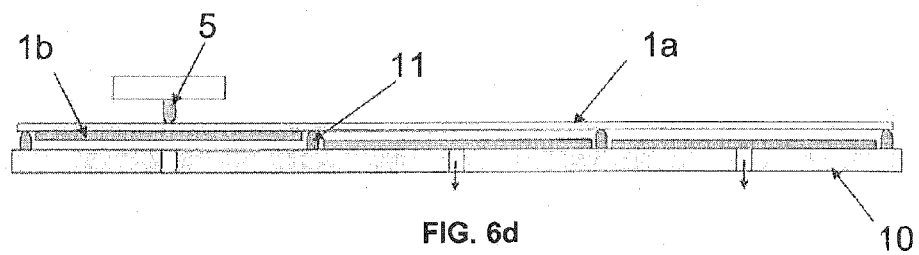

The bonding ends when the piston rod 5 reaches again its start position. The bonding wave has propagated over the whole surface of the second substrate 1b (FIG. 6d)

The method can then be applied on the next second substrate 1b or line of second substrates 1b. Advantageously, the piston rod 5 is mounted on a mobile device 6. This mobile device 6 is for example a 3-axis robot. It can move from one first line of substrate 1b to another and sequentially applies the strain F to them.

According to another advantageous embodiment of the invention, the whole first substrate 1a is deformed, and it is bound simultaneously to the plurality of second substrates 1b. In this case, as it can be seen in FIG. 8a, the bonding sequence begins with a step of pre-positioning the substrates. The first substrate 1a is held under vacuum by suckers or suction cups 3 at the extremity of telescopic arms 4 above a plurality of second substrates 1b which lay on the support 10. Each second substrate 1b may be held by at least one sucker or suction cup 12 embedded in the support 10. The center of the first surface 2a of substrate 1a is kept at least 100 μm above from surfaces 2b of the second substrates 1b.

For deforming this substrate 1a, a central element, for example a piston rod 5, is in contact with the substrate 1a at the point P1. Suckers or suction cups 3 and telescopic arms 4 are movable in rotation so that the substrate 1a can take a free form, imposed only by the points S1 and S2 of contact between the substrate (1a) and the suckers or suction cups 3, and the point P1 of contact with the head of the piston rod 5. By lengthening the piston rod 5, the strain F is applied and the point P1 get closer to the substrates 1b, as represented by FIG. 8b.

Figure 8D:
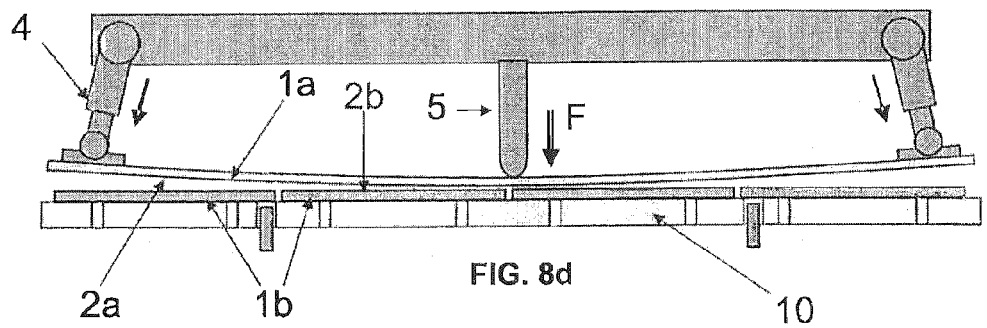

A contact force of less than 10 N (e.g. 2-10 N) is applied to begin the molecular bonding (FIG. 8c). The bonding propagation wave is then initiated by gradual release of the bending imposed on the first substrate 1a. For this, the telescopic arms are lengthened (FIG. 8d). The speed of this release is limited so that a uniform bonding wavefront propagates between the two substrates 1a-b.

Figure 8E:
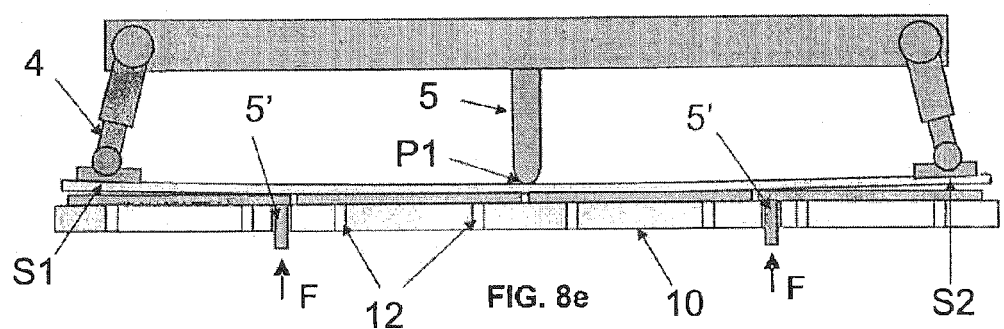
Figure 8F:
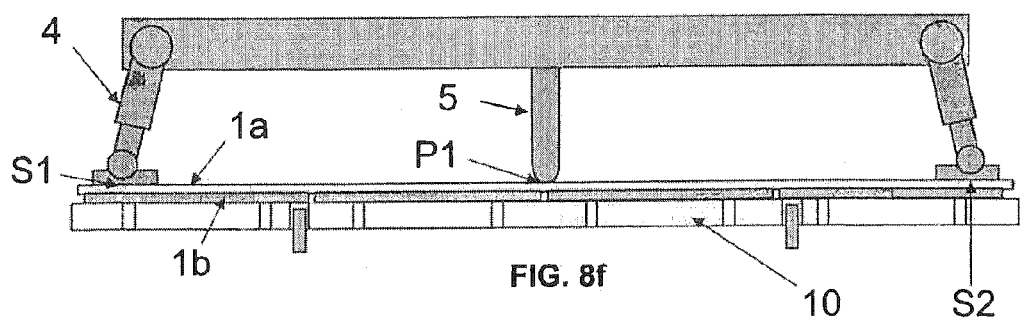

When the bonding wavefront reaches other second substrates 1b, as represented by FIG. 8e, advantageously auxiliary pistons rods 5' embedded in the structure 10 initiate bonding waves on the other second substrates 1b. Bonding sequence ends when the strains applied on the entire first substrate 1a are released (FIG. 8f).

In particular, it is important to distinguish two cases depending on the number of rows of second substrates 1b is odd or even. While this number is even (as shown in FIG. 8), the first contact is made on the edge of the two central rows. If this number is odd, the first contact is in the middle of the central row. The bonding mechanism is the same for the lateral rows.

This embodiment of the method according to the invention enables a high-speed industrial process, as a plurality of silicon tiles can be bound at once. Moreover, as only a small number of handlings are required, such a method guarantees a very precise bonding leading to high-quality products.

Although the preceding description mentions suckers or suction cups, this is intended to include other vacuum members or devices that are able to provide suction for holding the substrates.

What is claimed is:

1. A method for bonding a first substrate having a first surface to a second substrate having a second surface, which comprises:

holding the first substrate by at least two support points;

positioning the first substrate and the second substrate so that the first surface and the second surface face each other;

deforming the first substrate by applying between at least one pressure point and the two support points a strain toward the second substrate, wherein the strain is applied by at least one piston rod;

bringing the deformed first surface and the second surface into contact; and progressively releasing the strain to facilitate bonding of the substrates while minimizing or avoiding the trapping of air bubbles between the substrates.

2. The method according to claim 1, wherein the first substrate is a glass sheet, and wherein the second substrate is a silicon tile.

3. The method according to claim 1, wherein the first substrate is held by suckers or suction cups placed at the support points, and wherein each sucker or suction cup is optionally linked to a telescopic arm.

4. The method according to claim 1, wherein the second substrate is placed on a support comprising at least two spacers located respectively on each side of the second substrate, with the spacers being thicker than the thickness of the second substrate.

5. The method according to claim 4, wherein the first substrate is held by resting on the spacers, with the support points being points of contact between the spacers and the first substrate.

6. A method for bonding a first substrate having a first surface to a second substrate having a second surface, which comprises:

holding the first substrate by at least two support points;

positioning the first substrate and the second substrate so that the first surface and the second surface face each other;

deforming the first substrate by applying between at least one pressure point and the two support points a strain toward the second substrate;

bringing the deformed first surface and the second surface into contact; and progressively releasing the strain to facilitate bonding of the substrates while minimizing or avoiding the trapping of air bubbles between the substrates, wherein the first substrate is sequentially bonded to a plurality of second substrates by applying a strain to the first substrate per the second substrate.

7. The method according to claim 6, wherein the strain is applied by at least one piston rod that is mounted on a mobile device and that sequentially applies each strain to the first substrate.

8. The method according to claim 6, wherein the first substrate is a glass sheet, and wherein the second substrate is a silicon tile.

9. The method according to claim 6, wherein the first substrate is held by suckers or suction cups placed at the support points, and wherein each sucker or suction cup is optionally linked to a telescopic arm.

10. The method according to claim 6, wherein the second substrate is placed on a support comprising at least two spacers located respectively on each side of the second substrate, with the spacers being thicker than the thickness of the second substrate.

11. The method according to claim 10, wherein the first substrate is held by resting on the spacers, with the support points being points of contact between the spacers and the first substrate.

12. The method according to claim 10, wherein the support comprises at least one sucker or suction cup for holding the second substrate.

13. A method bonding a first substrate having a first surface to a second substrate having a second surface, which comprises:

holding the first substrate by at least two support points;

positioning the first substrate and the second substrate so that the first surface and the second surface face each other;

deforming the first substrate by applying between at least one pressure point and the two support points a strain toward the second substrate;

bringing the deformed first surface and the second surface into contact; and progressively releasing the strain to facilitate bonding of the substrates while minimizing or avoiding the trapping of air bubbles between the substrates, wherein the first substrate is simultaneously bonded to a plurality of second substrates by deforming the first substrate.

14. The method according to claim 13, wherein the first substrate is a glass sheet, and wherein the second substrate is a silicon tile.

15. The method according to claim 13, wherein the applied strain deforms the first substrate such that a central portion of the first substrate portion initially contacts the second substrate surface before the strain is released to propagate a bonding wave which bonds the substrates together.

16. The method according to claim 15, wherein the strain is applied in a linear manner so that the central portion of the first substrate contacts the second substrate in a line of contact before the strain is released to propagate a bonding wave which bonds the substrates together.

17. The method according to claim 13, wherein the first substrate is held by suckers or suction cups placed at the support points, and wherein each sucker or suction cup is optionally linked to a telescopic arm.

18. The method according to claim 13, wherein the second substrate is placed on a support comprising at least two spacers located respectively on each side of the second substrate, with the spacers being thicker than the thickness of the second substrate.

19. The method according to claim 18, wherein the first substrate is held by resting on the spacers, with the support points being points of contact between the spacers and the first substrate.

20. The method according to claim 13, wherein the support comprises at least one sucker or suction cup for holding the second substrate.

* * * * *

UNITED STATES PATENT AND TRADEMARK OFFICE
CERTIFICATE OF CORRECTION

| | | Page 1 of 1 |
|---|---|---|
| PATENT NO. | : 8,580,654 B2 | |
| APPLICATION NO. | : 13/248763 | |
| DATED | : November 12, 2013 | |
| INVENTOR(S) | : Kerdiles et al. | |

It is certified that error appears in the above-identified patent and that said Letters Patent is hereby corrected as shown below:

In the Claims

<u>Column 8:</u>
Line 15 (claim 13, line 1), after "method" insert -- for --.

Signed and Sealed this
Eleventh Day of February, 2014

Michelle K. Lee
*Deputy Director of the United States Patent and Trademark Office*